United States Patent
Shi et al.

(10) Patent No.: US 7,027,200 B2
(45) Date of Patent: Apr. 11, 2006

(54) ETCHING METHOD USED IN FABRICATIONS OF MICROSTRUCTURES

(75) Inventors: Hongqin Shi, San Jose, CA (US); Gregory P. Schaadt, Santa Clara, CA (US); Andrew G. Huibers, Palo Alto, CA (US); Satyadev R. Patel, Sunnyvale, CA (US)

(73) Assignee: Reflectivity, INC, Sunnyvale, CA (US)

( * ) Notice: Subject to any disclaimer, the term of this patent is extended or adjusted under 35 U.S.C. 154(b) by 258 days.

(21) Appl. No.: 10/666,002

(22) Filed: Sep. 17, 2003

(65) Prior Publication Data

US 2005/0020089 A1 Jan. 27, 2005

Related U.S. Application Data

(63) Continuation-in-part of application No. 10/627,302, filed on Jul. 24, 2003, now Pat. No. 6,965,468, and application No. 10/104,109, Mar. 22, 2002.

(51) Int. Cl.
*G02B 26/00* (2006.01)

(52) U.S. Cl. .................. 359/290; 359/291; 359/295; 359/298

(58) Field of Classification Search ................ 359/290, 359/291, 292, 293, 294, 295, 298
See application file for complete search history.

(56) References Cited

U.S. PATENT DOCUMENTS

| | | |
|---|---|---|
| 3,511,727 A | 5/1970 | Hays |
| 4,190,488 A | 2/1980 | Winters |
| 4,310,380 A | 1/1982 | Flamm et al. |
| 4,498,953 A | 2/1985 | Cook et al. |
| 4,551,197 A | 11/1985 | Guilmette et al. |
| 5,439,553 A | 8/1995 | Grant et al. |
| 5,604,367 A | 2/1997 | Yang |
| 5,726,480 A | 3/1998 | Pister |
| 5,835,256 A | 11/1998 | Huibers |
| 6,051,503 A | 4/2000 | Bhardwaj et al. |
| 6,115,172 A | 9/2000 | Jeong |
| 6,153,115 A | 11/2000 | Le et al. |
| 6,162,367 A | 12/2000 | Tai et al. |
| 6,197,610 B1 | 3/2001 | Toda |
| 6,204,080 B1 | 3/2001 | Hwang |
| 6,238,581 B1 | 5/2001 | Hawkins et al. |
| 6,290,864 B1 | 9/2001 | Patel et al. |
| 6,355,181 B1 | 3/2002 | McQuarrie |
| 6,396,619 B1 | 5/2002 | Huibers et al. |
| 6,409,876 B1 | 6/2002 | McQuarrie et al. |
| 6,436,229 B1 | 8/2002 | Tai et al. |
| 6,500,356 B1 | 12/2002 | Goto et al. |
| 6,576,489 B1 | 6/2003 | Leung et al. |

(Continued)

FOREIGN PATENT DOCUMENTS

EP 0704884 A2 4/1996

(Continued)

OTHER PUBLICATIONS

Aliev et al., "Development of Si(100) Surface Roughness at the Initial Stage of Etching in F2 and XeF2 Gases Ellipsometric Study", Surface Science 442 (1999), pp. 206-214.

(Continued)

*Primary Examiner*—Ricky L. Mack
*Assistant Examiner*—Brandi Thomas
(74) *Attorney, Agent, or Firm*—Gregory R. Muir

(57) ABSTRACT

The present invention discloses a method and apparatus for removing the sacrificial materials in fabrications of microstructures using a vapor phase etchant recipe having a spontaneous vapor phase chemical etchant. The vapor phase etchant recipe has a mean-free-path corresponding to the minimum thickness of the sacrificial layers between the structural layers of the microstructure. This method is of particular importance in removing the sacrificial layers underneath the structural layers of the microstructure.

16 Claims, 5 Drawing Sheets

U.S. PATENT DOCUMENTS

| | | |
|---|---|---|
| 2001/0002663 A1 | 6/2001 | Tai et al. |
| 2002/0033229 A1 | 3/2002 | Lebouitz et al. |
| 2002/0047172 A1 | 4/2002 | Reid |
| 2002/0121502 A1 | 9/2002 | Patel et al. |
| 2002/0163051 A1 | 11/2002 | Gopal et al. |
| 2002/0164879 A1 | 11/2002 | Leung et al. |
| 2002/0185699 A1 | 12/2002 | Reid |
| 2002/0195423 A1 | 12/2002 | Patel et al. |
| 2002/0196524 A1 | 12/2002 | Huibers et al. |
| 2003/0054588 A1 | 3/2003 | Patel et al. |
| 2003/0071015 A1 | 4/2003 | Chinn et al. |
| 2003/0077878 A1 | 4/2003 | Kumar et al. |
| 2003/0080082 A1* | 5/2003 | Chinn et al. .................. 216/2 |
| 2003/0124848 A1 | 7/2003 | Chinn et al. |
| 2003/0166342 A1 | 9/2003 | Chinn et al. |
| 2003/0219986 A1 | 11/2003 | Rattner et al. |
| 2004/0035821 A1 | 2/2004 | Doan et al. |
| 2004/0069747 A1 | 4/2004 | Patel et al. |
| 2004/0165250 A1* | 8/2004 | Aubuchon .................. 359/292 |

FOREIGN PATENT DOCUMENTS

| | | |
|---|---|---|
| EP | 0822582 A2 | 2/1998 |
| EP | 0822584 A2 | 4/1998 |
| EP | 0878824 A2 | 11/1998 |
| EP | 0878824 A3 | 1/2000 |
| JP | 1982/57098679 A | 6/1982 |
| JP | 1983/58130529 A | 8/1983 |
| JP | 1985/60057938 A | 4/1985 |
| JP | 1986/61053732 A | 3/1986 |
| JP | 1986/61134019 A | 6/1986 |
| JP | 1986/61181131 A | 8/1986 |
| JP | 1986/61187238 A | 8/1986 |
| JP | 1986/61270830 A | 12/1986 |
| JP | 1987/62071217 A | 4/1987 |
| JP | 1988/63155713 A | 6/1988 |
| JP | 1989/01208834 A | 8/1989 |
| JP | 1989/10217921 A | 8/1989 |
| JP | 1990/02250323 A | 10/1990 |
| JP | 1991/03012921 A | 1/1991 |
| JP | 1992/04096222 A | 3/1992 |
| JP | 1995/07029823 A | 1/1995 |
| JP | 1997/09251981 A | 9/1997 |
| JP | 1998/10313128 A | 11/1998 |
| JP | 1998/10317169 A | 12/1998 |
| WO | WO-98/32163 | 7/1998 |
| WO | WO-99/49506 | 9/1999 |

OTHER PUBLICATIONS

Glidemeister, J.M., "Xenon Difluoride Etching System" (Nov. 17, 1997).

Habuka et al., "Dominant Overall Chemical Reaction in a Chlorine Trifluoride-Silicon-Nitrogen System at Atmospheric Pressure", Japan Journal of Applied Physics vol. 38 (1999), pp. 6466-6469.

Hecht et al., "A Novel X-ray Photoelectron Spectroscopy Study of the Al/SiO2 Interface", J. Appl. Phys. vol. 57 (Jun. 15, 1985), pp. 5256-5261.

Houle, F.A, "Dynamics of SiF4 Desorption During Etching of Silicon by XeF2", IBM Almaden Research Center (Apr. 15, 1987), pp. 1866-1872.

Flamm et al., "XeF2 and F-Atom Reactions with Si: Their Significance for Plasma Etching", Solid State Technol. 26, 117 (1983).

Ibbotson et al., "Plasmaless Dry Etching of Silicon with Fluorine-containing Compounds", J. Appl. Phys. vol. 56 No. 10 (Nov. 1984), pp. 2939-2942.

Ibbotson et al., "Comparison of XeF2 and F-atom Reactions with Si and SiO2", Applied Physics Letter, vol. 44, 1129 (1984).

Streller et al., "Selectivity in Dry Etching of Si (100) and XeF2 and VUV Light", Elsevier Science B.V., Applied Surface Science vol. 106 (1996), pp. 341-346.

Vugts et al., "Si/XeF2 Etching: Temperature Dependence", J. Vac. Sci. Technol. A 14(5) (Sep./Oct. 1996), pp. 2766-2774.

Winters, H.F., "Etch Products from the Reaction of XeF2 with SiO2, SiO3, Si3N4, SIC, and Si in the Presence of Ion Bombardment", J. Vac. Sci. Technol. B 1(4) (Oct./Dec. 1983), pp. 927-931.

Kurt Williams, Etch Rates for Micromachining Processing-Part II, 2003 IEEE, pp. 761-778, Journal of Microelectromechanical Systems, vol. 12, No. 6, Dec. 2003.

Winters et al., "The Etching of Silicon with XeF2 Vapor", Appl. Phys. Letter, vol. 34(1) (Jan. 1, 1979), pp. 70-73.

XACTIX, Inc., Marketing Brochure (Jun. 27, 1999).

"Xenon Difluoride Isotropic Etch System: Seeing is Believing", Surface Technology Systems Ltd. brochure, Newport, UK (date unknown).

Chu et al., "Controlled Pulse-Etching with Xenon Difluoride", International Solid State Sensors and Actuators Conference (Transducers '97), Chicago, IL, vol. 1 (Jun. 16-19, 1997), pp. 665-668 (abstract only).

Bassom et al., "Modeling and Optimizing XeF2-enhanced FIB Milling of Silicon", 25th International Symposium for Testing and Failure Analysis, Santa Clara, CA (Nov. 14-18, 1999), pp. 255-261 (abstract only).

Kohler et al., "Fabrication of Microlenses by Plasmaless Isotropic Etching Combined with Plastic Moulding", Sens. Actuators A, Phys. (Switzerland), vol. A53, No. 1-3 (May 1996), pp. 361-363 (abstract only).

Chan et al., "Gas Phase Pulse Etching of Silicon for MEMS with Xenon Difluoride", Engineering Solutions for the Next Millenium: 1999 IEEE Canadian Conference on Electrical and Computer Engineering, Edmonton, Alberta, vol. 3 (May 9-12, 1999), pp. 1637-1642 (abstract only).

Chang et al., "Gas-Phase Silicon Micromachining with Silicon Difluoride", Proceedings of the SPIE—The International Socity for Optical Engineering, vol. 2641 (1995), pp. 117-128 (abstract only).

Sebel et al., "Reaction Layer Dynamics in Ion-Assisted SI/XeF2 Etching: Temperature Dependence", J. Vac. Sci. Technol. A, Vac. Surf. Films, vol. 18, No. 6, (Nov. 2000), pp. 2759-2769 (abstract only).

Sebel et al., "Silicon Etch Rate Enhancement by Traces of Metal", J. Vac. Sci. Technol. A, Vac. Surf. Films, vol. 17, No. 3, (May/Jun. 1999), pp. 755-762 (abstract only).

Sugano et al., "Study on XeF2 Pulse Etching Using Wagon Wheel Pattern", Proceedings of the 1999 International Symposium on Micromechantronics and Human Science: Towards the New Century, Nagoya, Japan (Nov. 23-26, 1999), pp. 163-167 (abstract only).

Wang et al., "Gas-Phase Silicon Etching with Bromine Trifluoride", International Solid State Sensors and Actuators Conference (Transducers '97), Chicago, IL, vol. 2 (Jun. 16-19, 1997), pp. 1505-1508 (abstract only).

Muthukumaran et al., "Gas-Phase Xenon Difluoride Etching Microsystems Fabricated Through the Mitel 1.5-mu m CMOS Process", Can J. Electr. Comput. Eng. (Canada), vol. 25, No. 1 (Jan. 2000), pp. 35-41 (abstract only).

Toda et al., "Thin Beam Bulk Micromachining Based on RIE and Xenon Difluoride Silicon Etching", International Solid State Sensors and Actuators Conference (Transducers '97), Chicago, IL, vol. 1 (Jun. 16-19, 1997), pp. 671-674.

Sebel et al., "Etching of Si Through a Thick Condensed XeF2 Layer", J. Vac. Sci. Technol. A, Vac. Surf, Films, vol. 18, No. 5 (Sep./Oct. 2000), pp. 2090-2097 (abstract only).

* cited by examiner

ETCHING METHOD USED IN FABRICATIONS OF MICROSTRUCTURES

CROSS-REFERENCE TO RELATED APPLICATIONS

This application is a continuation-in-part of a) U.S. patent application Ser. No. 10/627,302 to Patel et al, filed on Jul. 24, 2003 now U.S. Pat. No. 6,965,468; and b) U.S. patent application Ser. No. 10/104,109 to Patel et al, filed on Mar. 22, 2002. Each of the above applications is incorporated herein by reference in their entirety.

TECHNICAL FIELD OF THE INVENTION

The present invention is related generally to the art of fabrications of microstructures which includes such devices as microelectromechanical systems, semiconductor devices, and, more particularly, to etching processes in the fabrications of the microstructure.

BACKGROUND OF THE INVENTION

Sacrificial materials are commonly used in fabrications of microstructures such as microelectromechanical systems and semiconductor devices. Specifically, sacrificial layers having selected sacrificial materials are deposited between adjacent structural layers (e.g. between vertically disposed and laterally disposed structural layers) of the microstructures. A typical and pervasively used sacrificial material is amorphous silicon. Once the desired structure of the microstructure is formed, the sacrificial layers are removed by etching and the structural layers are left behind.

The success of the etching process depends upon the selectivity of the etching process, wherein the selectivity is defined as the ratio of the amount of the sacrificial material being removed to the amount of the materials of the structural layers being removed. Performance, uniformity and yield can all be improved with increase in the etch selectivity.

More recently, etching methods using selected vapor phase etchants have exhibited many advantages, such as high selectivity, less contamination and less process stiction in fabrications of microstructures as opposed to other available etching methods, such as wet etching techniques.

Accordingly, a method and apparatus is desired for removing sacrificial materials, especially the sacrificial material between vertically disposed structural layers in microstructures using selected vapor phase etchant with high efficiency and selectivity.

SUMMARY OF THE INVENTION

In view of the forgoing, the present invention discloses a method and apparatus for removing the sacrificial materials in fabrications of microstructures, especially the sacrificial materials between vertically disposed structural layers of the microstructures using one or more selected spontaneous vapor phase etchants. A spontaneous chemical etchant is an etchant such that a chemical reaction between said etchant and a sacrificial material occurs spontaneously and does not require activation energy. A spontaneous vapor phase etchant is a spontaneous chemical etchant that reacts with the sacrificial material in vapor phase. In an etching process, the etchant is mixed with a diluent gas to form an etchant recipe in vapor phase. The etchant recipe has a mean-free-path corresponding to the minimum thickness of the sacrificial layers between the structural layers of the microstructure.

In an embodiment of the invention, a method for removing a sacrificial material that is disposed within a gap between two structural layers of a microstructure using a vapor phase etchant recipe is disclosed. The method comprises: determining a size of the gap; preparing the vapor phase etchant recipe such that a mean-free-path of the etchant recipe is equal to or less than the gap size; and removing the sacrificial material of the microstructure using the prepared etchant recipe.

In another embodiment of the invention, a method is disclosed. The method comprises: loading a microstructure having a sacrificial material disposed within a gap between two vertically disposed structural layers of the microstructure into an etch system, wherein the gap has a size less than 1.5 micrometer; preparing a vapor phase etchant recipe such that a mean-free-path of the etchant recipe is equal to or less than the gap size; and removing the sacrificial material of the microstructure using the prepared etchant recipe.

In yet another embodiment of the invention, a method is disclosed. The method comprises: loading a microstructure having a sacrificial material disposed within a gap between two vertically disposed structural layers of the microstructure into an etch system; preparing a vapor phase etchant recipe such that a mean-free-path of the etchant recipe is equal to or less than 1.5 micrometers; and removing the sacrificial material of the microstructure using the prepared etchant recipe.

In yet another embodiment of the invention, a method is disclosed. The method comprises: loading a microstructure having a sacrificial material disposed within a gap between two adjacent vertically disposed structural layers of the microstructure into an etching system; preparing a vapor phase etchant recipe having a pressure higher than 2 atmospheres; and removing the sacrificial material of the microstructure using the prepared etchant recipe.

In yet another embodiment of the invention, a method for fabricating a micromirror is disclosed. The method comprises: preparing a substrate; depositing one or more sacrificial layers; forming a mirror plate and a hinge layer on the one or more sacrificial layers; preparing a vapor phase etchant recipe such that a mean-free-path of the etchant recipe is equal to or less than a minimum thickness of the one or more sacrificial layers; and removing the sacrificial layers using the prepared etchant recipe.

In yet another embodiment of the invention, an etching system for removing a sacrificial material disposed within a gap between two structural layers of a microstructure is disclosed. The system comprises: an etchant source containing a spontaneous vapor phase chemical etchant that chemically reacts with the sacrificial material for removing the sacrificial material from the microstructure; a diluent gas source containing a diluent gas; an etch chamber containing the microstructure for preparing an etchant recipe having the chemical etchant, wherein the etch chamber further comprises: a rotatable sample holder for holding the microstructure such that the microstructure rotates with the sample holder within the etch chamber; an exchange chamber connected to the etchant source, the diluent gas source and the etchant chamber; a chamber gate that is attached to the exchange chamber and the etch chamber for allowing a gas to flow between the exchange chamber and the etch chamber when the chamber gate is open; and a pump connected to the exchange chamber for pumping out the gas in the exchange chamber out of the exchange chamber.

BRIEF DESCRIPTION OF DRAWINGS

While the appended claims set forth the features of the present invention with particularity, the invention, together with its objects and advantages, may be best understood from the following detailed description taken in conjunction with the accompanying drawings of which:

DETAILED DESCRIPTION OF THE EMBODIMENTS

The present invention teaches a method and apparatus for removing the sacrificial materials disposed within the gap between vertically and/or laterally disposed structural layers of the microstructures in fabrications of the microstructures using one or more selected spontaneous vapor phase etchants.

In the etching process, the vapor phase etchant is mixed with a diluent gas to form an etchant recipe in vapor phase. The etchant recipe has a mean-free-path that corresponds to the minimum size of the gap among one or more gaps having the sacrificial layers and between the vertically disposed structural layers of the microstructure. In general, the mean-free-path of can be larger, equal to or smaller than the gap, but preferably smaller than the gap. Specifically, the mean-free-path of the etchant recipe is preferably equal to or less than a value that is 2 times of the gap size, and more preferably the mean-free-path is equal to or less than a value that is 1.5 times of the gap size, and more preferably the mean-free-path is equal to or less than a value that is 90 percent of the gap size, and more preferably the mean-free-path is equal to or less than a value that is 50 percent of the gap size, and more preferably from 90 percent to 1.5 times of the gap size. The vapor phase etchant recipe is provided to an etching system containing the microstructure. In the etching system, the etchant recipe diffuses to and chemically reacts with the sacrificial layers of the microstructure and generates reaction products in vapor phase that can be evacuated out of the etching system. Because the etchant recipe has a shorter mean-free-path than the minimum gap size, it is able to remove sacrificial layers between vertically disposed structural layers (i.e. the sacrificial layers underneath the structural layers).

Figure 1A:
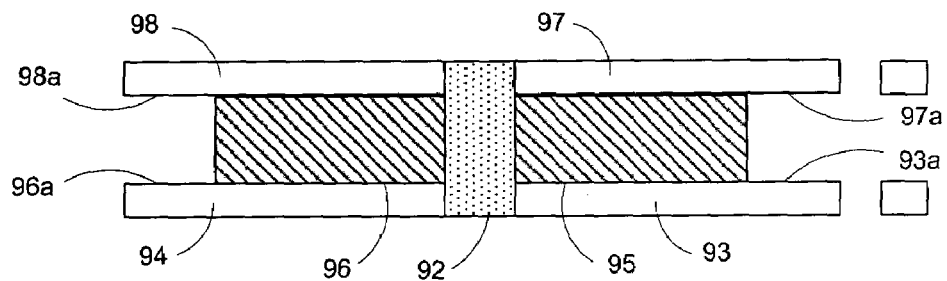
FIG. 1a is a cross-section view of a portion of a microstructure having a sacrificial material deposited between two vertically disposed adjacent structural layers and between laterally disposed adjacent structural layers of a microstructure.

Turning to the figures, FIG. 1a is a cross-section view of a portion of a microstructure comprising structural layers 93, 94, 97 and 98 and sacrificial layers 92, 95 and 96 in a fabrication process. Sacrificial layers 95 and 96 are respectively disposed between vertically disposed structural layers 94 and 98 and structural layers 93 and 97. Sacrificial layer 92 is disposed between the laterally disposed structural layers 97 and 98 and structural layers 93 and 94. Once the structural layers of the microstructure are formed, the sacrificial layers in between need to be removed to release the microstructure.

The sacrificial layers are removed through a chemical reaction between the sacrificial material of the sacrificial layers and a suitable chemical etchant. The chemical etchant is preferably a spontaneous vapor phase chemical etchant and chemically reacts with the sacrificial material, wherein the reaction products from the chemical reaction are in vapor phase and can thus be evacuated from the etching system using gas-pump facilities.

In order to enable the chemical reaction, gas molecules of the etchant need to be in contact with molecules of the sacrificial material. This contact is accomplished through diffusion of the etchant molecules to the sacrificial layers, which will be discussed in detail in the following.

Diffusion of the Etchant in to the Sacrificial Layers

The diffusion of the etchant molecules to the sacrificial layers in the etching process of the present invention occurs because of concentration gradient (which is often referred to as ordinary diffusion), provided that none of pressure gradient, thermo gradient and external forces to the etchant molecules present in the diffusion process. There are two types of ordinary diffusion mechanisms—one is the molecule diffusion and the other one is the Knudsen diffusion. The molecule diffusion proceeds through collision of the gas molecules, such as the etchant gas molecules, while the Knudsen diffusion proceeds through collision of gas molecules with structures of the microstructure and/or walls of the container containing the gas.

In the etching process, the diffusion type is determined by a comparison of the mean-free-path of the gas to the minimum size of the gap among the gaps having the sacrificial material and between the vertically disposed structural layers. For example, the diffusion of the etchant molecules into sacrificial layer 95 is determined by a comparison of the mean-free-path of the etchant molecules to the distance between structural layers 93 and 97. In this example, the distance is the thickness of the sacrificial layer.

Mean-Free-Path

Figure 1B:
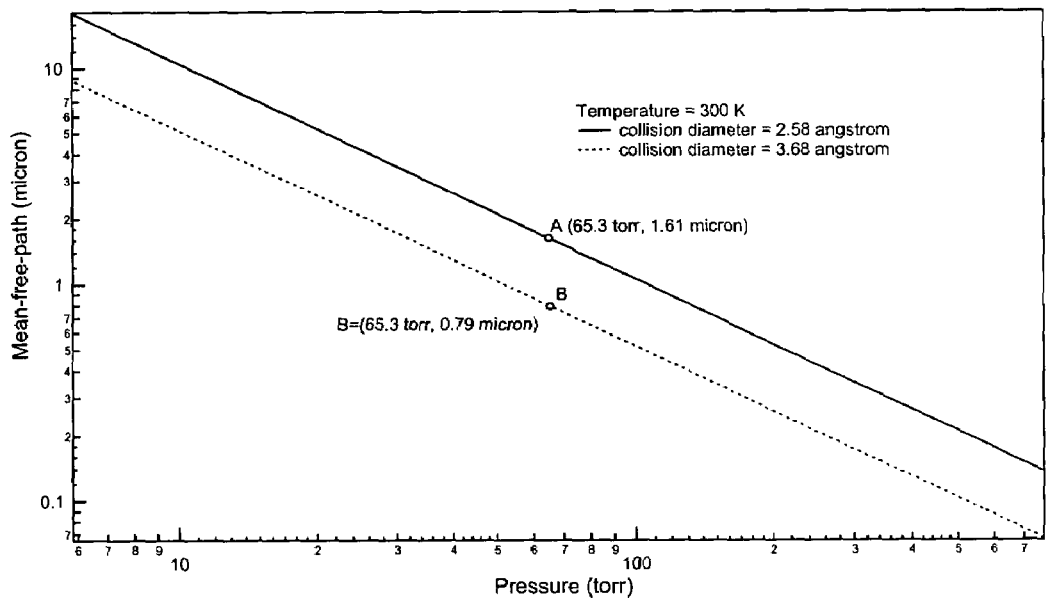
FIG. 1b plots mean-free-path versus pressure for different molecules.

The mean-free-path measures the average distance a gas molecule (e.g. the etchant gas molecule) can travel before undergoing a collision, and can be expressed as:

$$\lambda = \frac{RT}{\sqrt{2}\,\pi\sigma^2 P\tilde{N}} \qquad \text{Equation 1}$$

wherein $\lambda$ is the mean-free-path. T is the absolute temperature in $°K$. $\sigma$ is the collision diameter in angstrom and $\sigma^2$ is the collision cross-section. P is the pressure of the gas in atmosphere (atm). R is the gas constant equal to 82.05 $cm^3 \cdot atm \cdot g \cdot mole^{-1} \cdot °K^{-1}$. And $\tilde{N}$ is the Avogadro's constant equal to 6.02×10²³ molecules·g·mole⁻¹. FIG. 1*b* plots the mean-free-path versus pressure in logarithmic scale for two different types of gases.

In FIG. 1*b*, the line represents the mean-free-path of gases versus pressure at room temperature 300° K in logarithmic scale, wherein the molecules of the gas have an average collision diameter of 2.58 angstrom. The dash-line represents the mean-free-path of a gas versus pressure at room temperature 300° K in logarithmic scale, wherein the molecules of the gas have an average collision diameter of 3.68 angstrom. It can be seen from the figure that the gas with a smaller collision diameter has a larger mean-free-path at a given pressure and temperature. For example, at pressure 65.3 torr, the mean-free-path of the gas having a collision diameter around 2.58 angstrom is 1.61 micrometer, whereas the mean-free-path of the gas having collision diameter 3.68 angstrom is 0.79 micrometer.

If the mean-free-path of the gas is less than the gap size of the structures, such as the gap between structure layers 94 and 98, or the gas between layers 93 and 97, the diffusion of the gas into sacrificial layer 96 is dominated by collisions among gas molecules. If the mean-free-path of the gas is larger than the gas size, the diffusion is dominated by collisions of the molecules of the gas and the structure layers.

In the etching process, an etchant recipe having the selected gas etchant is provided in the etching system. The molecules of the gas etchant can diffuse to the sacrificial layers, such as sacrificial layer 92 in FIG. 1*a*, which are directly exposed to the gas etchant regardless of the mean-free-path or the gap size between layers 97 and 98 or between layers 95 and 96. The diffusion of the etchant gas molecules into the sacrificial layers (e.g. layer 95 and 96) that are not directly exposed to the etchant gas, however, requires collisions among the gas molecules. This type of diffusion occurs when the mean-free-path is smaller than the size of the gap having the sacrificial material. That is, in order to efficiently remove the sacrificial layers not directly exposed to the etchant gas, the gas etchant is prepared such that the mean-free-path of the etchant gas corresponds to the gap size. In general, the mean-free-path of can be larger, equal to or smaller than the gap, but preferably smaller than the gap. Specifically, the mean-free-path of the etchant recipe is preferably equal to or less than a value that is 2 times of the gap size, and more preferably the mean-free-path is equal to or less than a value that is 1.5 times of the gap size, and more preferably the mean-free-path is equal to or less than a value that is 90 percent of the gap size, and more preferably the mean-free-path is equal to or less than a value that is 50 percent of the gap size, and more preferably from 90 percent to 1.5 times of the gap size.

According to the invention, the etchant is preferably a spontaneous vapor phase chemical etchant that chemically reacts with the sacrificial material of the sacrificial layers in the microstructure, wherein the reaction products are also in vapor phase and can be evacuated from the etching system using gas pumping facilities. For example, the vapor phase chemical etchant can be selected from a group comprising interhalogen (e.g. bromine trifluoride), noble gas halide (e.g. xenon difluoride) and HF.

In order to remove the sacrificial material of the sacrificial layers that are not directly exposed to the etchant recipe, such as sacrificial layers 96 between vertically disposed structure layers 93 and 97, the chemical etchant is mixed with a diluent gas, which is preferably a inert gas selected from a group comprising He, $N_2$, Ne, Ar, Kr and Xe. The gas mixture of the etchant and the diluent gas is referred to as an etchant recipe. The pressure (total pressure) of the vapor phase etchant recipe is determined based upon the size of the gap having the sacrificial material at a given temperature. Specifically, the pressure of the etchant recipe is set to a value such that the mean-free-path of the etchant recipe is equal to or less than the size of the gap at a given temperature that is preferably around 300 K. For example, the pressure of the etchant recipe for removing sacrificial layers 96 in FIG. 1*a* is set to a value such that the mean-free-path of the etchant recipe is less than the gap (distance) between vertically disposed structural layers 94 and 98 at a given temperature. In this example, the thickness of sacrificial layer is the gap size. In a microstructure having a multiplicity of gaps filled with a sacrificial material and the gaps having different sizes, the pressure of the etchant recipe is set to a value such that the mean-free-path of the etchant recipe is equal to or less than the minimum size of the gap among the gaps between vertically disposed structural layers.

According to the invention, the total pressure of the vapor phase etchant recipe is from 1 to 700 torr, and more preferably from 20 to 300 torr, more preferably from 20 to 200 torr, and more preferably from 35 to 100 torr. As a way of example, nitrogen gas is used as the diluent gas. The nitrogen gas molecules have an average collision diameter around 3.68 angstrom. As shown in the dash-line in FIG. 1*b*, at room temperature around 300 K, the mean-free-path of the nitrogen gas ranges from 0.17 to 2.2 micrometers when the pressure varies from 300 to 20 torr. Above 300 torr, the mean-free-path does not change significantly and converges to a value around 0.1 micrometers. The mean-free-path is from 1.5 to 0.5 micrometer when the pressure is within the range from 35 to 100 torr. The etchant gas and the diluent gas of the etchant recipe have different partial pressures. In an embodiment of the invention, the ratio of the partial pressure of the etchant to the partial pressure of the diluent gas is preferably from 1/1000 to 1/100, and more preferably from 4/100 to 6/200.

With the proper mean-free-path, the etchant recipe efficiently removes the sacrificial layers. In particular, the etchant recipe removes the sacrificial layers not directly exposed to the etchant, or the sacrificial layers underneath the structural layers, such as the sacrificial layers (e.g. layer 96) between vertically disposed structure layers (e.g. layers 94 and 98).

In addition to the mean-free-path, selectivity is another parameter that dominates the etching success. The selectivity is defined as:

$$\text{selectivity} = \frac{\text{etching rate of the sacrificial material}}{\text{etching rate of the structural materials}} \quad \text{Equation 2}$$

$$= \alpha \frac{\text{diffusivity inside the gap between structural layers}}{\text{diffusivity to the surface of the structural layers}}$$

$$= \alpha \frac{D_{gap}}{D_{bulk}}$$

wherein $\alpha$ is a coefficient determined by parameters other than diffusivity. In particular, $\alpha$ is a parameter describes the chemical reaction between the material and the etchant. For example, when the material is aluminum and the etchant is $XeF_2$, $\alpha$ is infinite. The etching rate is defined as the amount of materials removed per unit time. The diffusivity is defined through Fick's first law of diffusion in a binary system having two types of gas molecules A and B.

$$J_A = -cD_{AB}\nabla x_A \qquad \text{Equation 3}$$

$J_A$ is the molar diffusion flux. c is the molar density of the etchant recipe and equals $c_A + c_B$, wherein $c_A$ and $c_B$ are molar concentrations of A and B, respectively. $x_A$ equals $c_A/c$ and denotes the molar fraction of A. $\nabla x_A$ is the gradient of the molar fraction of A. $D_{AB}$ is the diffusivity of A in the A-B binary system.

In a diffusion following the molecular diffusion mechanism, the diffusivity $D_{AB}$ can be expressed as:

$$D_{AB} = 1.8583 \times 10^{-7} \frac{\sqrt{T^3\left(\frac{1}{M_A} + \frac{1}{M_B}\right)}}{P\sigma_{AB}^2 \Omega_{AB}} \qquad \text{Equation 4}$$

wherein T is the temperature. $M_A$ and $M_B$ are molar weights of molecules A and B, respectively. P is the pressure. $\sigma_{AB}$ is the collision diameter of A and B in the A-B binary system. $\Omega_{AB}$ is a dimensionless function of temperature and intermolecular potential between two molecules A and B.

In a diffusion following the Knudsen diffusion mechanism, the diffusivity $D_{AB}$ can be written as:

$$D_{kA} = \frac{d}{3}\sqrt{\frac{8RT}{\pi M_A}} = 48.5d\sqrt{\frac{T}{M_A}} \qquad \text{Equation 5}$$

wherein d measures the gap that is between the structural layers and filled with the sacrificial material. R is the ideal-gas constant.

As afore described, when the mean-free-path of the vapor phase etchant recipe is less than then size of the gap having the sacrificial material, both diffusions of the etchant molecules into the sacrificial material and into the structural layers obey the molecular diffusion mechanism. That is, $$D_{gap} = D_{bulk} = D_{AB}; \text{ and} \qquad \text{Equation 6}$$
$$Selectivity = \frac{D_{gap}}{D_{bulk}} = \alpha$$

When the mean-free-path of the vapor phase etchant is larger than the size of the gap between the vertically disposed structural layers, such as sacrificial layers 95 and 96 in FIG. 1a, the diffusion of the etchant molecules into the sacrificial layer in the gap follows the Knudsen diffusion mechanism. In this situation, the diffusion is accomplished through collisions of the etchant molecules with the inner surfaces (e.g. surfaces 98a, 94a, 97a and 93a) of the structural layers forming the gap (e.g. layers 94 and 98, and 93 and 97). Therefore, the diffusivity of the etchant molecules into those sacrificial layers (layers 96 and 95) is the Knudsen diffusivity of equation 5, that is, $$D_{gap} = D_{kA} \qquad \text{Equation 7}$$

The diffusivity of the etchant molecules into the structural layers still obeys the molecular diffusion mechanism, that is $$D_{bulk} = D_{AB} \qquad \text{Equation 8}$$

By combining equations 2, 4, 5, 7, and 8, the selectivity can be expressed as:

$$Selectivity = \alpha \frac{D_{gap}}{D_{bulk}} = \alpha \frac{D_{kA}}{D_{AB}} \qquad \text{Equation 9}$$

As an example, $XeF_2$ is the A component and helium is the B component of the A-B binary system. $\Omega_{AB}$ is 1. $\sigma_{AB}$=0.5 $(\sigma_A + \sigma_B)$=0.5×(2.339+2.576)=2.4575 angstrom. $M_A$ is 207.3 and $M_B$ is 4. The etchant recipe (including $XeF_2$ and helium gas) is used to remove amorphous silicon within a gap having a size d of 0.5 micrometer at room temperature 300 K. By substituting the parameters into equations 4 and 5, diffusivities can be reduced to:

$$D_{AB} = \frac{1.644 \times 10^{-5}}{P} \text{ and,} \qquad \text{Equation 10}$$

$$D_{kA} = 2.71123 \times 10^{-5} \qquad \text{Equation 11}$$

By combining equations 9, 10 and 11, the selectivity can be written as:

$$selectivity = \alpha \frac{D_{kA}}{D_{AB}} = \alpha \frac{2.71123}{1.64414}P = 1.65\alpha P \qquad \text{Equation 12}$$

wherein P is the pressure of the etchant recipe in atmosphere.

By comparing equation 12 with 6, it can be seen that when P is smaller than 1/1.65, the selectivity obtained from equation 12 is smaller than that of equation 6. As an example, P is 3 torr (0.00395 atm), the mean-free-path of the etchant recipe is 7.8 micrometer, which is larger than the gas size 0.5 micrometer. The selectivity of equation 12 in this example can be calculated as $0.0065\alpha$, which is much lower than the selectivity of $\alpha$ obtained from equation 6 when the pressure is high such that the mean-free-path of the etchant recipe is larger than the gap size 0.5 micrometer. Therefore, the etchant recipe is expected to have a pressure such that the mean-free-path of the etchant recipe is equal to or less than the size of the gap having the sacrificial material.

Although high pressure etchant recipe benefits high etching selectivity, it may degrade the etching uniformity during the etching process. An optimum pressure is thus desired during the etching process. The optimum pressure is such a pressure at which the mean-free-path of the etchant recipe equals the size of the gap. Specifically, the derived mean-free-path from the pressure equals the size of the gap that is filled with the sacrificial material and not directly exposed to the sacrificial etchant recipe, such as sacrificial layers 95 and 96.

In the above example, in which the size of the gap (e.g. the distance between layers 94 and 98, or the thickness of sacrificial layer 96 in FIG. 1) is 0.5 micrometer, the desired mean-free-path corresponding to the optimum pressure is 0.5 micrometer. The optimum pressure can thus be calculated as 50 torr from equation 1.

In addition to the pressure, the diffusion mechanism and the diffusivity also depend upon the molecular weight and collision diameter of the molecules involved. It can be seen from FIG. 1b and equations 4 and 5, molecules having a larger collision diameter (e.g. the dash-line) corresponds to a smaller pressure compared to the molecules having a smaller collision diameter (e.g. the continuous line). For example, the mean-free-path of 1.61 micrometer of molecules having a diameter of 3.68 angstrom corresponds to 29.7 torr. Whereas the same mean-free-path of molecules having a diameter of 2.58 angstrom corresponds to 65.3 torr. In view of this fact, the diluent gas preferably has a collision diameter of from 1.8 angstrom or higher, more preferably 2.3 angstrom or higher, more preferably 4.0 angstrom or higher, and more preferably 10 angstrom or higher.

From equation 4, it can be seen that the molecular diffusivity decreases with the increase of the molar weight of the etchant recipe molecules. And the selectivity of equation 12 increases with the decrease of the molecular diffusivity. Therefore, the selectivity of equation 12 increases with the increase of the molar weight of the etchant recipe molecules. In this regards, the diluent gas of the etchant recipe preferably has a large molar weight.

Figure 2:
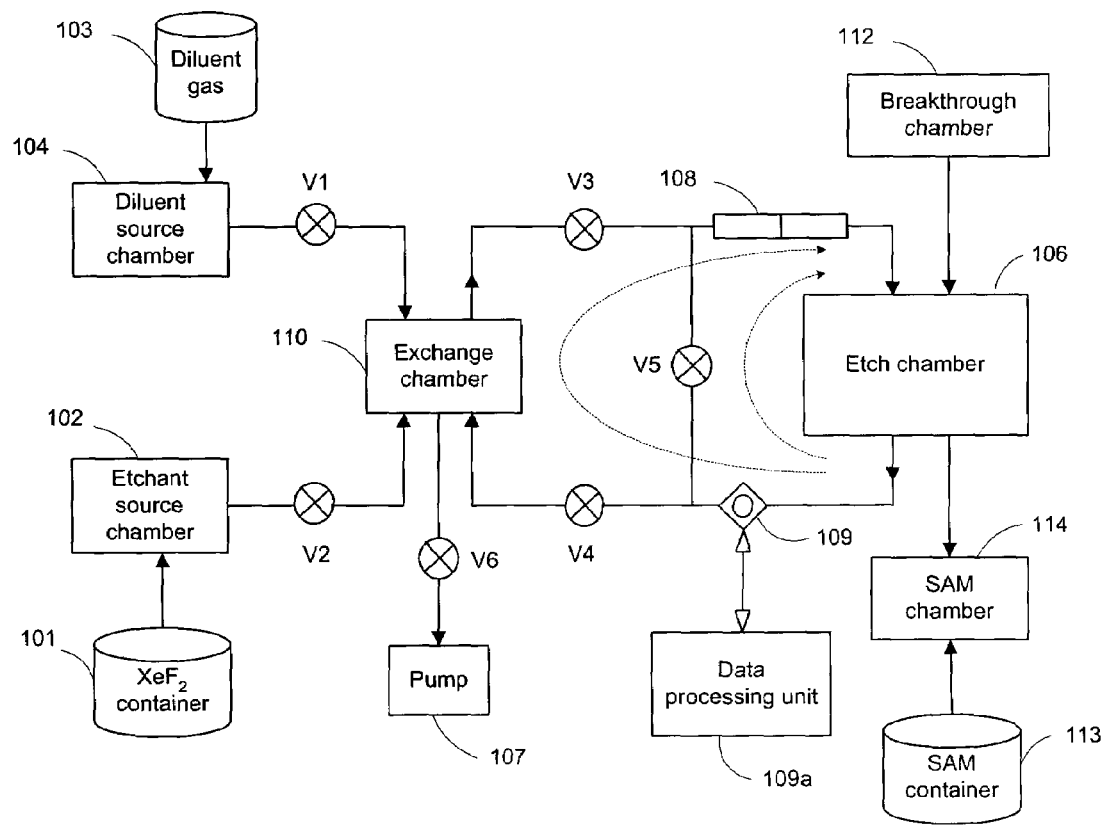
FIG. 2 is a block diagram illustrating an etching system according to embodiment of the invention.

Referring to FIG. 2, an exemplary etching system, in which the embodiment of the invention may be implemented. The etching system comprises etch chamber 106 and exchange chamber 110. The etch chamber contains the microstructure (e.g. micromirror) having a sacrificial material (e.g. amorphous silicon) to be removed. A chemical etchant that reacts with the sacrificial material and generate reaction products in vapor phase that can be evacuated from the etching system is selected. In the embodiment of the invention, the etchant is selected from a group comprising interhalogen, noble gas halide and HF. In particular, when the sacrificial material is amorphous (or porous) silicon, xenon difluoride is selected as the etchant. The spontaneous vapor phase $XeF_2$ is then mixed with a diluent gases to form an etchant recipe in the exchange chamber. In the embodiment of the invention, the diluent gas is preferably an inert gas, such as nitrogen, helium, argon, krypton, neon or xenon or a mixture of one or more inert gases, and more preferably an inert gas having a large collision diameter and large molar weight. The cubic volume of the exchange chamber is preferably much less than (e.g. around one twentieth of or one fiftieth of) the cubic volume of the etch chamber such that the amount of the mixed gas of $XeF_2$ and the diluent gas is smaller than the mixed gas (including the etchant, the diluent gas and the etching products) in the etch chamber. As a result, the feeding of the mixed gas into the etch chamber during one feeding cycle does not dramatically change the etching process, such as the etching rate inside the etch chamber.

The exchange chamber, the etch chamber and valve V3, circulation pump 108, valve V4 and detector 109 form the outer circulation loop illustrated as a dotted line. The etch chamber, circulation pump 108, valve V5 and detector form the inner circulation loop as illustrated in another dotted line. The arrows in the figure represent the flow direction of the mixed gases within the etching system. Of course, the flow directions can be reversed, as long as all flow directions within each segment of the flow path are reversed. The circulation pump 108 continuously pumps the gases passing by so as to maintain the circulation via the two loops. The detector dynamically measures the concentration of a reaction product such as $SiF_4$ gas. The measured concentration is then analyzed by the processing unit to obtain the progress information on the etching process inside the etch chamber. In the embodiment of the invention, the detector is a MKS Process Sense that uses Infra-Red light to detect the reaction products. Other detectors, such as a Residual Gas Analyzer from AMETEK may also be employed. The detector is connected to data processing unit 109a, which calculate relevant parameters (e.g. etching rate, surface area of the sacrificial material) from the measured concentration. Rather than the data processing unit, the embodiments of the present invention may also be implemented in a microprocessor-based programmable unit, and the like, using instructions, such as program modules, that are executed by a processor. Generally, program modules include routines, objects, components, data structures and the like that perform particular tasks or implement particular abstract data types. The term "program" includes one or more program modules. When the embodiments of the present invention are implemented in such a unit, it is preferred that the unit communicates with the detector and takes corresponding actions based upon the measured data, such as adjusting the concentrations of the selected chemical species.

Valves V3, V4 and V5 switch the circulation via the inner circulation loop and the outer circulation loop. Specifically, the outer circulation loop is activated by opening (e.g. allowing the gas to flow through) valves V3 and V4, and closing (e.g. blocking the gas to flow through) valve V5. The inner circulation loop is activated by opening valve V5 and closing valves V3 and V4.

The exchange chamber is further connected to diluent source chamber 104 via valve V1, and the diluent source chamber is connected to diluent gas cylinder 103. In the embodiment of the invention, helium is preferably used as the diluent gas and contained in the diluent gas cylinder. Of course, other suitable gases, such as inert gas (e.g. nitrogen, Ar, Kr and Xe) may also be used as the diluent gas. In addition to the diluent source chamber, the exchange chamber is also connected to etchant source chamber 102 via valve V2 and pump 107 via valve V6. The etchant source chamber is further connected to the etchant gas container, such as $XeF_2$ container 101.

In the following, an exemplary etching process will be discussed. For simplicity and demonstration purposes without losing the generality, the following discussion assumes that helium gas is used as the vapor phase diluent gas and xenon difluoride is selected to remove amorphous silicon in the microstructure.

Before the etching process, the minimum size of the gaps that are filled with the sacrificial material in the microstructure is estimated. A mean-free-path corresponding to the minimum size of the gap is calculated. The exemplary etching process begins with filling the exchange chamber and the etch chamber with helium gas that has a pressure preferably of from 1 to 700 torr, and more preferably from 20 to 500, and more preferably from 20 to 100 torr, as long as the mean-free-path of the diluent gas is equal to or less than the minimum size of the gap within the microstructure. This filling step is achieved by opening valves V1, V3, V4, V5 and closing valves V2 and V6 for a time period, preferably around 500 milliseconds until the diluent gas inside the etching system reaches equilibrium. The exchange chamber is then pumped out so as to reduce the pressure inside exchange chamber and meanwhile, circulating the diluent gas through the inner loop for a time period preferably from 100 to 1500 milliseconds. This step is accomplished by opening valve V5 and valve V6 and closing valves V1, V2, V3 and V4. As a result, the pressure inside the exchange chamber is reduced to a pressure of from 1 to 15 torr, while the pressure inside etch chamber 106 is maintained at its initial pressure. Because the pressure of the exchange chamber is equal to or below the pressure of $XeF_2$ inside etchant source chamber 102, $XeF_2$ can thus flow into the exchange chamber by opening valve V2 and closing valves V1, V3, V4 and V6. At this step, valve V5 is left open—allowing the diluent gas to keep on circulating via the inner circulation loop.

At this point, an etchant recipe having the etchant gas and the diluent gas is prepared. The partial pressure of the etchant gas is preferably of from 1 to 15 torr, and more preferably around 4 torr. A ratio of the partial pressure of the etchant gas to the partial pressure of the diluent gas is from 1/1000 to 1/100, and more preferably from 6/100 to 4/200. During this step, a first amount of $XeF_2$ flows into the exchange chamber. The amount may be controlled by the duration of opening valve V2. Alternatively the amount can be controlled through controlling the duration of the opening of valve V6. For example, by controlling the open duration of valve V6, the pressure of the gas left inside the exchange chamber can be set to a desired pressure value, such as 1 torr, 2 torr and 3 torr, wherein the desired pressure corresponds to the desired additional amount of $XeF_2$ to be filled into the exchange chamber. For example, when the pressure of the gas inside the exchange chamber is set to 1 torr, an additional amount of $XeF_2$ corresponding to 3 torr (3 torr=4 torr−1 torr) is fed into the exchange chamber when valve V2 is opened. In the embodiment of the invention, the duration of opening valve V2 is preferably around 500 milliseconds. The helium diluent gas mixes with the $XeF_2$ etchant gas and reaches equilibrium. This step is accomplished by opening valve V1 and closing valves V2, V3, V4 and V6 for a time duration preferably around 100 milliseconds. After the $XeF_2$ gas is mixed with the helium gas, the mixed gas is then fed into etch chamber 106. This feeding step is accomplished by opening valve V3 and valve V4 and closing the rest of the valves, including valves V1, V2, V5, and V6. It can be seen that, by closing valve V5 and opening valves V3 and V4, the inner circulation loop is closed and the outer circulation loop is opened. As a result, the mixed gas flows via the outer circulation loop and passes through the etch chamber for etching the amorphous silicon through the chemical reaction inside the etch chamber. This step may last for a time period, preferably from 1000 to 3000 milliseconds, depending upon the measurement result of the detector 109.

After the feeding of the first amount of the etchant recipe into the etch chamber, additional etchant recipes maybe fed into the etch chamber to maintain a constant etching rate of the sacrificial material. The timing for feeding the additional amount of the etchant recipe can be determined in many ways. In an embodiment of the invention, the additional etchant recipes are fed according to a sequence of feeding cycles. An amount of the etchant recipe is fed into the etch chamber during a time slot in each feeding cycle.

For example, during the first time slot of the first feeding cycle, a first amount of the selected etchant recipe is fed into the etch chamber. The etchant recipe then chemically reacts with the sacrificial material—resulting reaction products, also in gas phase. The chemical reaction consumes the selected etchant of the etchant recipe and decreases the amount of the etchant inside the etch chamber. This decrease slows down and may even stop the chemical reaction within the etch chamber before all sacrificial materials are removed. Therefore, a second amount of the selected etchant is fed into the etch chamber during the second time slot of the second feeding cycle. For the same reason, a third amount of the selected etchant is fed into the etch chamber during the third time slot of the third feeding cycle, if the sacrificial material within the etch chamber is not removed. The feed process continues until all sacrificial materials are removed or in practice, the amount of the sacrificial material inside the etch chamber is below a predefined value. The durations of the feeding cycles and time intervals between adjacent feeding cycles may or may not be the same. Instead, the duration of the feeding cycles, and the time interval between adjacent time slots are individually adjustable. This benefits the control of the etching rate (e.g. defined as the amount of sacrificial materials removed through the chemical reaction per second) through out the etching process. In an embodiment of the invention in which $XeF_2$ is used as the etchant for removing amorphous silicon in micromirror devices, the etching rate is preferably from 10 to 50 angstroms per second, more preferably from 20 to 30 angstroms per second, and more preferably around 20 angstroms per second.

In another embodiment of the invention, additional etchant recipes are fed into the etch chamber based on a measurement of the detector. For example, the detector dynamically measures the concentration of the etchant inside the etch chamber. Whenever a decrease of the concentration is observed, an additional amount of the etchant is fed into the etch chamber so as to maintain a constant concentration of the etchant within the etch chamber. As a result, a constant etch rate can be obtained.

When the concentration of the etchant can not be measured precisely, the detector can measure the concentration of an etch product, such as $SiF_4$ using Infra-Red light. In this case, the derivative ($dC_{SiF4}/dt$) is calculated in real-time by the data processing unit. These parameters are then used to derive the surface area of the amorphous silicon so as to determine whether the surface area changes. If the surface area changes, an additional amount of the etchant recipe is prepared and fed into the etch chamber.

After the sacrificial material is totally removed, the etching process can be terminated and the microstructure can be unloaded from the etch chamber.

After the removal of the sacrificial materials such as amorphous silicon, materials of the functional layers of the microstructure are left. Exemplary such materials of the functional layers comprises: elemental metals (e.g. Al, Au, Pt, and Cu) or metalloid (not Si, and Ge), metal alloys that comprises two or more elemental metals, intermetallic compounds (e.g. $Ni_xAl_x$, $Ti_xAl_y$ and TiNi) and ceramics (but not WN). A ceramic is a compound wherein a metal (or metalloid) is bounded to a non-metal. The ceramics for the microstructures comprise transition metal nitride (e.g. $TiN_x$, $TaN_x$ and $CrN_x$), transition metal oxide (e.g. $TiO_x$, $TaO_x$ and $CrO_x$), transition metal carbide (e.g. $WC_x$, $TiC_x$, $TaC_x$ and $CrC_x$), transition metal oxynitride (e.g. $TiO_xN_y$, and $TaO_xN_y$), transition metal silicon nitride (e.g. $TiSi_xN_y$, and $TaSi_xN_y$), transition metal silicon oxynitride (e.g. $TiSiO_xN_y$, and $TaSiO_xN_y$), metalloid nitride (e.g. $SiN_x$), metalloid oxide (e.g. $SiO_x$), metalloid carbide (e.g. $SiC_x$), metalloid oxynitride (e.g. $SiO_xN_y$) or other ternary and higher compounds.

After the etching process, other optional processes, such as coating the microstructure with self-assembly-monolayer (SAM) material, can be performed after step 137. Specifically, the etch chamber is pumped out to remove the gases from inside the etch chamber. The microstructure is unloaded from the etch chamber and transferred into the SAM chamber (SAM chamber 114 in FIG. 2). The SAM chamber is then filled with the SAM material so as to coat the microstructure with the SAM material. After the coating, the microstructure is unloaded from the SAM chamber. In transferring the microstructure from one chamber (e.g. the etchant chamber) to another (e.g. the SAM chamber), a load-lock that connects the chambers is preferably employed. During a transfer from one chamber to another, the microstructure is unloaded from the first chamber and loaded into the load-lock before loading the microstructure into the second chamber.

In addition to SAM coating process, breakthrough etch may also be applied to the microstructure. Specifically, the breakthrough etch for removing the non-spontaneously-etchable films on the sacrificial materials is performed at breakthrough chamber 112 (in FIG. 2) before etching the microstructure using spontaneous vapor phase $XeF_2$. After the completion of the breakthrough etch, the microstructure is unloaded from the breakthrough chamber and transferred into the etch chamber.

Figure 3:
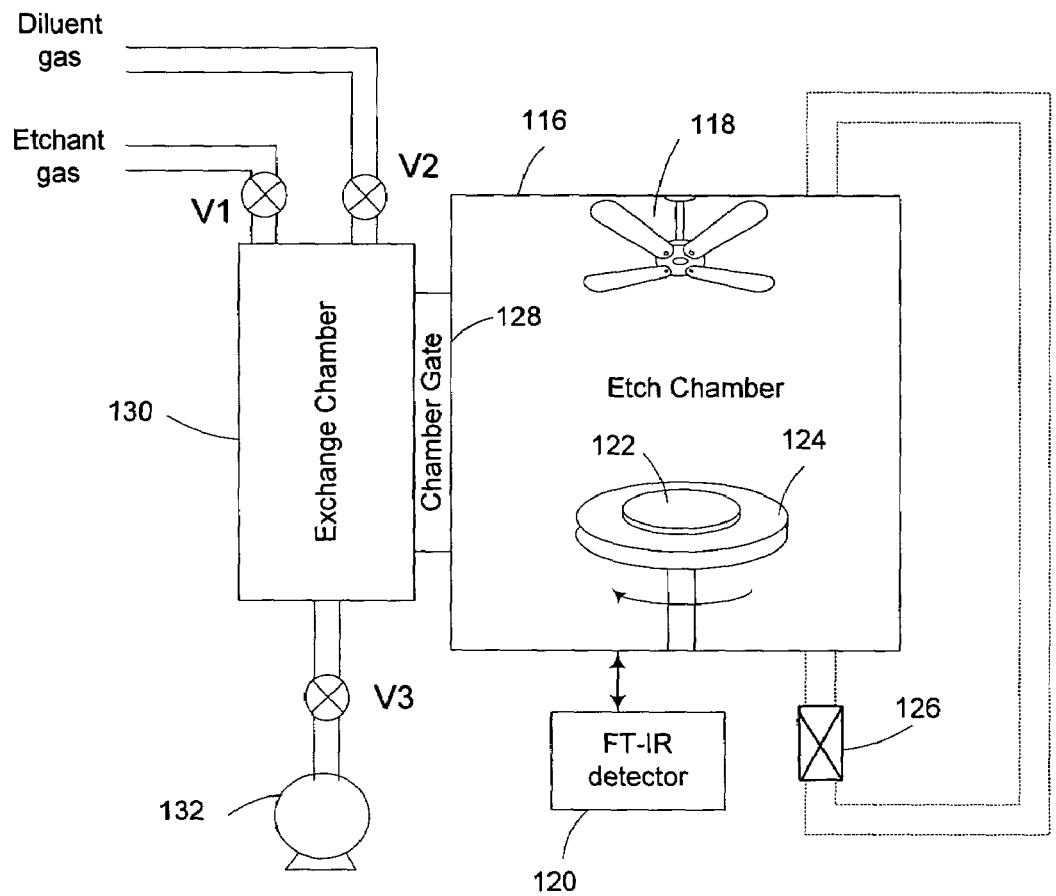
FIG. 3 is a block diagram schematically illustrating a portion of an etching system according to another embodiment of the invention.

Referring to FIG. 3, a portion of another etching system in which embodiments of the invention may be implemented is illustrated therein. Exchange chamber 130 is connected to a diluent gas source and etchant gas source, which can be mixed properly inside the exchange chamber. Specifically, the partial pressure of the etchant gas within the gas mixture can be adjusted by pump 132 and valve V3 connected to the exchange chamber. Etch chamber 116 is connected to the exchange chamber via chamber gate 128 that controls the gas flow from the exchange chamber into the etch chamber. This arrangement clearly benefits the etchant feeding speed from the exchange chamber to the etch chamber. In an embodiment of the invention, the etching sample (e.g. microstructure 122) is held by rotatable sample holder 124 such that the etching sample rotates along with the sample holder. As a result, the etchant gas can be uniformly distributed on the etching sample surface, and the sacrificial material within the etching sample can be uniformly removed. Alternatively, agitator 118, such as a fan, can be disposed proximate to the etching sample for agitating the etchant gas within the etch chamber.

The etching system may further comprise pump 126 that is connected to the etch chamber for pumping out the gas mixture (including the etchant, the diluent gas and the etching products) out of the etch chamber. Alternatively, the etch system may have a circulation loop comprises of pump 126 and the etch chamber for circulating the etchant, as well as the diluent gas through the etch chamber. In this case, the pump is used for maintaining the circulation.

As an alternative feature of the embodiment, detector 120, which is preferably a Fourier-Transformation Infra-Red detector, is provided to dynamically measure the concentration of the etchant (e.g. $XeF_2$) inside the etch chamber. The measured concentration of the etchant is analyzed (e.g. by a data processing unit, which is not shown) and used to control the etchant feeding processes so as to maintain a constant etching rate. For example, when the detector detects a decrease of the concentration of $XeF_2$ inside the etch chamber, an additional amount of $XeF_2$ (or a mixture of the amount of $XeF_2$ and a diluent gas) is fed into the etch chamber to balance the decrease.

As a way of example, a fabrication process using the etching process of the present invention for removing amorphous silicon used as the sacrificial material within a micromirror array of a spatial light modulator will be discussed in the following.

Figure 4:
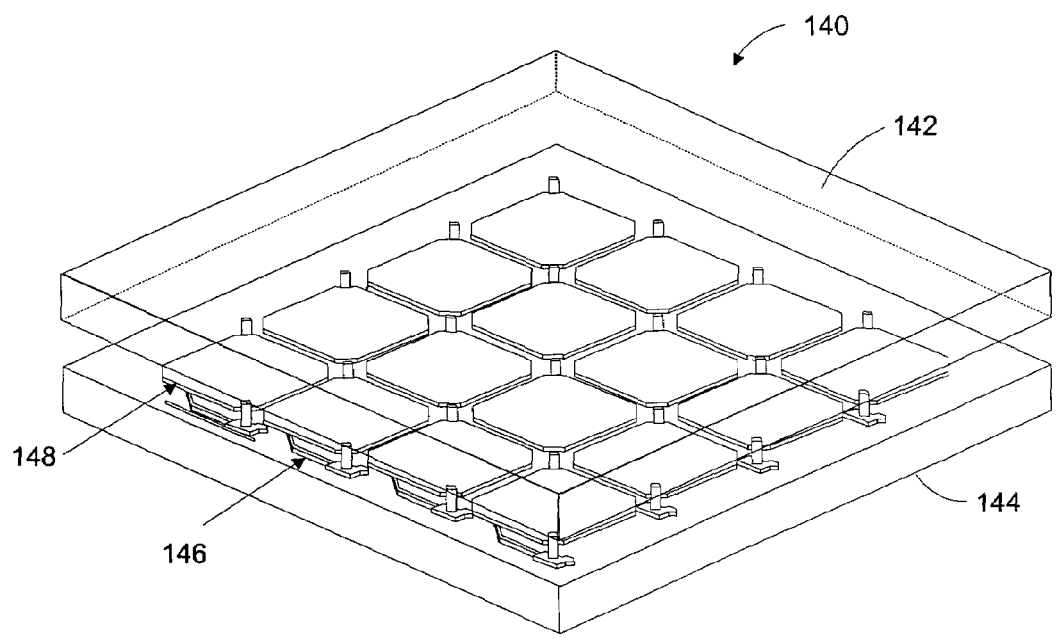
FIG. 4 is a perspective view of a portion of an exemplary micromirror array that is fabricated using a fabrication process, in which the etching method according an embodiment of the invention is employed.

Referring to FIG. 4, a perspective view of a portion of a spatial light modulator 140 is illustrated therein. The spatial light modulator comprises an array of micromirrors 148 and array of electrodes 146. In this particular example, the micromirrors are formed on substrate 142, such as quartz or glass that is transmissive to visible light. And the electrode array is formed on substrate 144 which is a standard semiconductor wafer. In addition to the electrode array, a circuit array, such as a DRAM or SRAM array is also formed on substrate 144. Each circuit maintains a voltage signal and is connected to one electrode such that the voltage of the electrode is defined by the voltage signal in the circuitry. Each electrode is associated with a micromirror such that an electric field can be established between the electrode and a rotatable mirror plate of the micromirror and the electrode associated with the micromirror. In this way, the rotation of the mirror plate, thus the state of the micromirror can be controlled.

Figure 5:
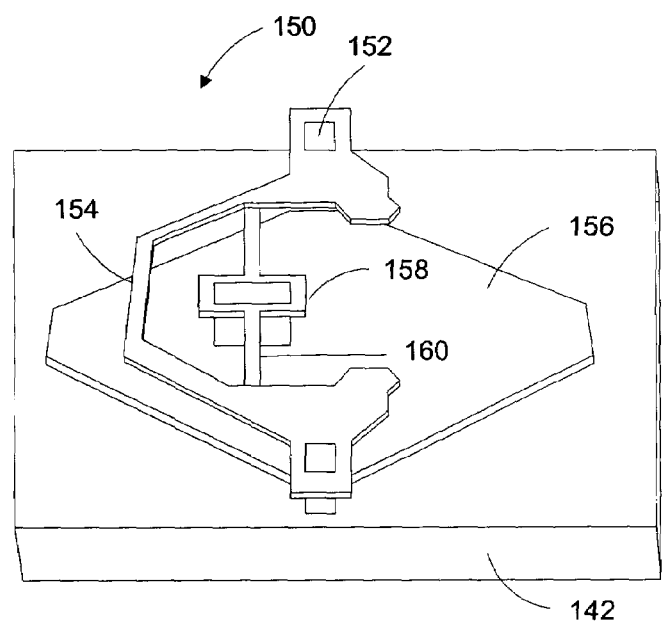
FIG. 5 is a perspective view of a portion of a micromirror of the micromirror array of FIG. 4.

FIG. 5 schematically illustrates a perspective view of a micromirror of the micromirror array 148 in FIG. 4. As can be seen, the micromirror comprises mirror plate 156, hinge 160, hinge contact 158 and hinge support 154. The mirror plate is connected to the hinge through the contact. And the hinge is affixed to the hinge support that is formed on substrate 142. With this configuration, the mirror plate is able to rotate asymmetrically along the rotation axis in two opposite rotation directions and achieves a large ON state angle compared to the ON state angles achieved by those micromirrors rotating symmetrically.

There is a variety of ways to construct the micromirror device described above, such as the fabrication methods disclosed in U.S. Pat. Nos. 5,835,256 and 6,046,840 both to Huibers, the subject matter of each being incorporated herein by reference. Regardless of the fabrication process, sacrificial materials are deposited between structures of the micromirrors and removed afterwards. For example, a sacrificial material is deposited between the mirror plate and the hinge to which the mirror plate is attached. The order of the fabrication steps for the mirror plate and the hinge depends upon the selected fabrication process and other factors, such as substrate. In particular, the mirror plate can be fabricated before the hinge, and alternatively, it can be fabricated after the hinge. For example, when the substrate is a silicon wafer, the hinge is fabricated before the mirror plate on the silicon wafer. For another example, when a glass substrate that is transmissive to visible light is used, the mirror plate is then fabricated before fabricating the hinge on the glass substrate. The sacrificial material also fills the space, such as gaps between adjacent micromirrors of the micromirror array. Removal of those sacrificial materials, however, is not a trivial process. In the embodiment of the invention, the size of the gap between the hinge and the mirror plate is preferably from 0.15 to 0.45 microns, although the distance between the mirror plate and the hinge can be 0.15 to 1.5 microns according to the present invention. In order to efficiently remove sacrificial materials between the structures of the micromirrors, a spontaneous vapor phase chemical etching process is employed, which will be described in the following discussion on an exemplary fabrication process.

A demonstrative fabrication process for making the micromirror and the micromirror array device of the present invention will be discussed in the following with references to FIG. 6a through FIG. 6c. U.S. patent application Ser. No. 09/910,537 filed on Jul. 20, 2001 and 60/300,533 filed on Jun. 22, 2001 both to Reid contain examples of the materials that may be used for the various components of the present invention. These patent applications are also incorporated herein by reference. It should be appreciated by those of ordinary skill in the art that the exemplary processes are for demonstration purpose only and should not be interpreted as limitations. In particular, although not limited thereto, the exemplary micromirror is formed on a glass substrate that is transparent to visible light. And electrode and circuitry are formed on a separate substrate, such as a silicon wafer.

Alternatively, the micromirror and the electrode and circuitry can be formed on the same substrate.

Figure 6A:
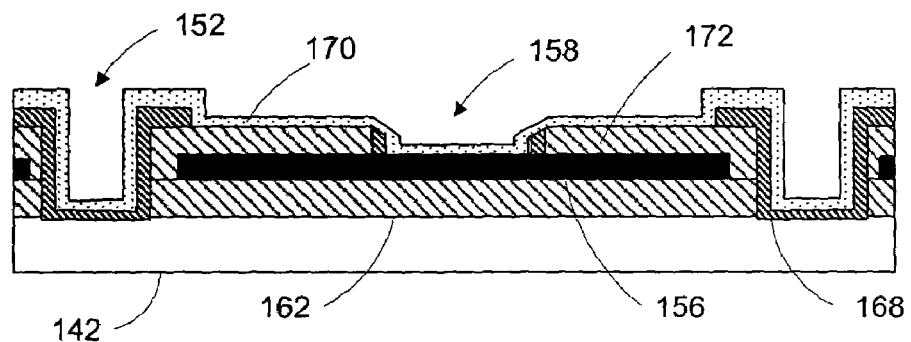
FIG. 6a is a cross-section view of the micromirror in FIG. 5 during the fabrication process.
Figure 6B:
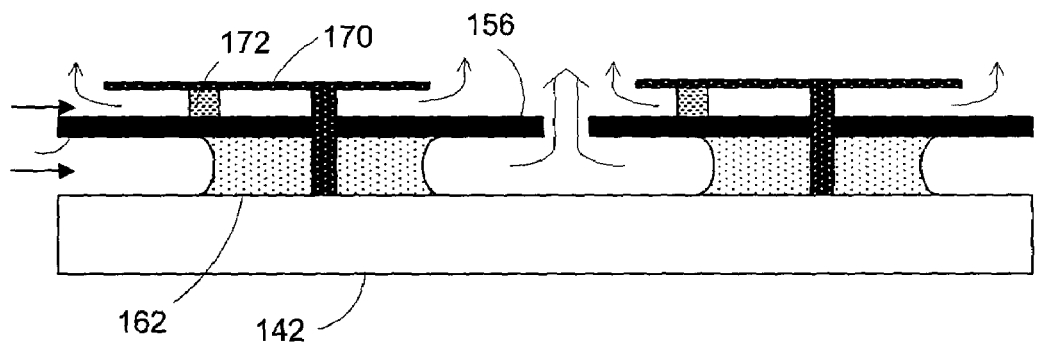
FIG. 6b is a cross-section view of two adjacent micromirrors of micromirror array in FIG. 4 during the fabrication process.
Figure 6C:
FIG. 6c is a cross-section view of the micromirror in FIG. 6a after removing the sacrificial materials.

Referring to FIG. 6a, a cross-section view of a micromirror FIG. 5 during an exemplary fabrication process is illustrated therein. The micromirror is formed on substrate 142, which can be glass (e.g. 1737F, Eagle 2000, quartz, Pyrex™, sapphire) that is transparent to visible light. First sacrificial layer 162 is deposited on the substrate followed by forming mirror plate 156. The first sacrificial layer may be any suitable material, such as amorphous silicon, or could alternatively be a polymer or polyimide, or even polysilicon, silicon nitride, silicon dioxide and tungsten, depending upon the choice of sacrificial materials, and the etchant selected. In the embodiment of the invention, the first sacrificial layer is amorphous silicon, and it is preferably deposited at 300–350° C. The thickness of the first sacrificial layer can be wide ranging depending upon the micromirror size and desired title angle of the micro-micromirror, though a thickness of from 500 Å to 50,000 Å, preferably around 25,000 Å, is preferred. The first sacrificial layer may be deposited on the substrate using any suitable method, such as LPCVD or PECVD.

According to the invention, the thickness of the mirror plate is from 500 Å to 50,000 Å, preferably around 2500 Å. Moreover, the mirror plate is a multi-layered structure, which comprises a $SiO_x$ layer with a preferred thickness around 400 Å, a light reflecting layer of aluminum with a preferred thickness around 2500 Å, a titanium layer with a preferred thickness around 80 Å, and a 200 Å $TiN_x$ layer. In addition to aluminum, other materials, such as Ti, AlSiCu and TiAl, having high reflectivity to visible light can also be used for the light reflecting layer. These mirror plate layers can be deposited by PVD at a temperature preferably around 150° C.

After deposition, the mirror plate is patterned into a desired shape. The patterning of the micromirror can be achieved using standard photoresist patterning followed by etching using, for example CF4, Cl2, or other suitable etchant depending upon the specific material of the micromirror plate layer.

After patterning the mirror plate, second sacrificial layer 172 is deposited on the mirror plate. The second sacrificial layer may comprise amorphous silicon, or could alternatively comprise one or more of the various materials mentioned above in reference to the first sacrificial layer. First and second sacrificial layers need not be the same, although they are the same in the preferred embodiment so that, in the future, the etching process for removing these sacrificial materials can be simplified. Similar to the first sacrificial layer, the second sacrificial layer may be deposited using any suitable method, such as LPCVD or PECVD. In the embodiment of the invention, the second sacrificial layer comprises amorphous silicon deposited at approximate 350° C. The thickness of the second sacrificial layer can be on the order of 12,000 Å, but may be adjusted to any reasonable thickness, such as between 2,000 Å and 20,000 Å depending upon the desired distance (in the direction perpendicular to the micromirror plate and the substrate) between the micromirror plate and the hinge. It is preferred that the hinge and mirror plate be separated by a gap with a size from 0.1 to 1.5 microns, more preferably from 0.1 to 0.45 micron, and more preferably from 0.25 to 0.45 microns. Larger gaps could also be used, such as a gap from 0.5 to 1.5 micrometers, or from 0.5 to 0.8 micrometer, or from 0.8 to 1.25 micrometers, or from 1.25 to 1.5 micrometers.

The deposited second sacrificial layer is then patterned for forming two deep-via areas 152 and shallow via area 158 using standard lithography technique followed by etching, as shown in the figure. The etching step may be performed using $Cl_2$, $BCl_3$, or other suitable etchant depending upon the specific material(s) of the second sacrificial layer. The distance across the two deep-via areas depends upon the length of the defined diagonal of the micromirror plate. In an embodiment of the invention, the distance across the two deep-via areas after the patterning is preferably around 10 μm, but can be any suitable distance as desired. In order to form the shallow-via area, an etching step using $CF_4$ or other suitable etchant may be executed. The shallow-via area, which can be of any suitable size, is preferably on the order of 2.2 square microns. And the size of each deep-via is approximate 1.0 micron.

After patterning the second sacrificial layer, hinge structure layer 170 is deposited on the patterned second sacrificial layer. The hinge structure layer preferably comprises a 400 Å thickness of $TiN_x$ (although it may comprise $TiN_x$, and may have a thickness between 100 Å and 2000 Å) layer deposited by PVD, and a 3500 Å thickness of $SiN_x$ (although the thickness of the $SiN_x$ layer may be between 2000 Å and 10,000 Å) layer 350 deposited by PECVD. Of course, other suitable materials and methods of deposition may be used (e.g. methods, such as LPCVD or sputtering). The $TiN_x$ layer is not necessary for the invention, but provides a conductive contact surface between the micromirror and the hinge in order to, at least, reduce charge-induced stiction.

After the deposition, hinge structure layer 250 is patterned into a desired shape. An etching step using one or more proper etchants is executed in patterning the hinge structure layer. In particular, the layer can be etched with a chlorine chemistry or a fluorine chemistry where the etchant is a perfluorocarbon or hydrofluorocarbon (or $SF_6$) that is energized so as to selectively etch the hinge support layers both chemically and physically (e.g. a plasma/RIE etch with $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Different etchants may, of course, be employed for etching each hinge support layer (e.g. chlorine chemistry for a metal layer, hydrocarbon or fluorocarbon (or $SF_6$) plasma for silicon or silicon compound layers, etc.). After deposition, the hinge layer is then patterned using the same technology applied in patterning the hinge structure layer After the hinge is formed, the micromirror is released by removing the first and second sacrificial layers. In order to efficiently remove the sacrificial material (e.g. amorphous silicon), a spontaneous vapor phase gas etchant recipe is prepared. The etchant recipe comprises a spontaneous vapor phase etchant, preferably selected from a group comprising interhalogen (e.g. $BrF_3$), noble gas halide (e.g. $XeF_2$) and HF. In this example, xenon difluoride is selected as the etchant gas. The etchant recipe further comprises a diluent gas which is preferably an inert gas that is selected from a group comprising $N_2$, He, Ne, Ar, Kr and Xe. The diluent gas preferably has a large collision diameter and a large molar weight. The etchant recipe is prepared according to the minimum size of the gap having the sacrificial material. In this example, the minimum gas size is the distance between the mirror plate and the hinge. According to an embodiment of the invention, the etchant recipe is prepared such that the mean-free-path of the etchant recipe gas is equal to or less than the distance between the mirror plate and the hinge.

The preparation of the etchant recipe and the etching process using the prepared etchant recipe are performed in the etching system as described with reference to FIG. 2 and FIG. 3. FIG. 6b illustrates a cross-sectional view of the micromirror during the etching process. As shown in the figure, the sacrificial material within the gaps (e.g. the gap between the hinge and the mirror plate, the gap between the substrate and the mirror plate, and the gap between adjacent micromirrors) is removed. The etching products in gas phase flow out from the gaps and are evacuated outside the etching system.

After the sacrificial material and the sacrificial layers are removed, the micromirror device is released such that the mirror plate is able to rotate relative to the substrate. A cross-sectional view of the released micromirror device is illustrated in FIG. 6c.

It will be appreciated by those skilled in the art that a new and useful apparatus and method for removing sacrificial materials of microstructures have been described herein. In view of many possible embodiments to which the principles of this invention may be applied, however, it should be recognized that the embodiments described herein with respect to the figures are meant to be illustrative only and should not be taken as limiting the scope of invention. For example, those of skill in the art will recognize that the illustrated embodiments can be modified in arrangement and detail without departing from the spirit of the invention. For example, the sacrificial layers, if silicon, could also be removed by other spontaneous chemical vapor phase etchants, such as other noble gas halides or interhalogens (bromine trifluoride, bromine trichloride, etc.). For another example, a plurality of exchange chambers may be provided for feeding the etchant recipe. At each feeding cycle, one or more exchange chambers are selected to prepare the etchant recipe and feed the prepared etchant recipe into the etch chamber, whereas it is preferred that different exchange chambers are selected for prepared and feeding etchant recipes in successive feeding cycles. Therefore, the invention as described herein contemplates all such embodiments as may come within the scope of the following claims and equivalents thereof.

We claim:

1. A method for fabricating a micromirror, the method comprising:
    preparing a substrate;
    depositing one or more sacrificial layers;
    forming a mirror plate and a hinge layer on the one or more sacrificial layers;
    preparing a vapor phase etchant recipe such that a mean-free-path of the etchant recipe is equal to or less than a minimum thickness of the one or more sacrificial layers; and
    removing the sacrificial layers using the prepared etchant recipe.

2. The method of claim 1, wherein the mean-free-path is equal to or less than 1.5 micrometer; and wherein the minimum thickness of the sacrificial layer is around 1.5 micrometers or larger.

3. The method of claim 1, wherein the mean-free-path is equal to or less than 0.5 micrometers; and wherein the minimum thickness of the sacrificial layer is around 0.5 micrometers or larger.

4. The method of claim 1, wherein the sacrificial material is amorphous silicon.

5. The method of claim 1, wherein the step of preparing the etchant recipe further comprises: preparing the etchant recipe by mixing a spontaneous vapor phase chemical etchant with a diluent gas, wherein the chemical etchant is from a group comprising an interhalogen gas, a noble gas halide and HF.

6. The method of claim 5, wherein the interhalogen comprises bromine trifluoride; and
    wherein the noble gas halide comprises $XeF_2$.

7. The method of claim 1, wherein the diluent gas is selected from a group comprising He, $N_2$, Ar, Kr, Ne and Xe.

8. The method of claim 1, wherein the etchant recipe has a total pressure of from 1 to 700 torr.

9. The method of claim 1, wherein the etchant recipe has a total pressure higher than 2 atmospheres.

10. The method of claim 1, wherein the chemical etchant of the etchant recipe has a partial pressure from 1 to 15 torr.

11. The method of claim 1, wherein the diluent gas has a partial pressure of from 1 to 700 torr.

12. The method of claim 1, wherein a ratio of a partial pressure of the chemical etchant gas to a partial pressure of the diluent gas is from 1/1000 to 1/10.

13. The method of claim 1, wherein the ratio is from 6/100 to 4/200.

14. The method of claim 1, wherein the step of depositing one or more sacrificial layers further comprises: depositing a first sacrificial layer between the substrate and the mirror plate and a second sacrificial layer between the mirror plate and the hinge layer.

15. The method of claim 14, wherein the second sacrificial layer has a thickness around 1.5 micrometers or less.

16. The method of claim 14, wherein the second sacrificial layer has a thickness around 0.5 micrometers or less.

* * * * *